US009912872B2

(12) United States Patent
Hautson et al.

(10) Patent No.: US 9,912,872 B2
(45) Date of Patent: Mar. 6, 2018

(54) METHOD FOR CONTROLLING A GRAPHICAL INTERFACE FOR DISPLAYING IMAGES OF A THREE-DIMENSIONAL OBJECT

(71) Applicant: COMMISSARIAT A L'ENERGIE ATOMIQUE ET AUX ENERGIES ALTERNATIVES, Paris (FR)

(72) Inventors: Tristan Hautson, Fontaine (FR); Timothee Jobert, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 306 days.

(21) Appl. No.: 14/786,309

(22) PCT Filed: May 5, 2014

(86) PCT No.: PCT/EP2014/059140
§ 371 (c)(1),
(2) Date: Oct. 22, 2015

(87) PCT Pub. No.: WO2014/180797
PCT Pub. Date: Nov. 13, 2014

(65) Prior Publication Data
US 2016/0065855 A1    Mar. 3, 2016

(30) Foreign Application Priority Data

May 7, 2013   (FR) ...................................... 13 54157

(51) Int. Cl.
*H04N 5/232*   (2006.01)
*G01R 33/00*   (2006.01)
(Continued)

(52) U.S. Cl.
CPC ..... *H04N 5/23293* (2013.01); *G01R 33/0005* (2013.01); *G01R 33/0094* (2013.01);
(Continued)

(58) Field of Classification Search
CPC .................................................. G01R 33/0005
See application file for complete search history.

(56) References Cited

U.S. PATENT DOCUMENTS

| 5,687,307 A | 11/1997 | Akisada et al. |
| 2006/0061354 A1 | 3/2006 | Wallance et al. |
| 2009/0174714 A1 | 7/2009 | Nagakura et al. |

FOREIGN PATENT DOCUMENTS

| EP | 1 650 641 A2 | 4/2006 |
| FR | 2 586 302 | 2/1987 |
| WO | 2011 043645 | 4/2011 |

OTHER PUBLICATIONS

International Search Report dated Jun. 12, 2014 in PCT/EP14/059140 Filed May 5, 2014.

*Primary Examiner* — Kee M Tung
*Assistant Examiner* — Grace Q Li
(74) *Attorney, Agent, or Firm* — Oblon, McClelland, Maier & Neustadt, L.L.P.

(57) ABSTRACT

A method for controlling a graphical interface includes: calculating coordinates of a permanent magnet and direction of magnetic moment of the permanent magnet from magnetometer measurements; matching dimensions of a three-dimensional object with the calculated coordinates by multiplying each dimension of the three-dimensional object by a coefficient to obtain a three-dimensional object brought to scale and by multiplying the calculated coordinates by inverse of a coefficient to obtain scaled coordinates; constructing a two-dimensional image corresponding to the image of the object brought to scale observed from a viewpoint and along an optical axis deduced from the scaled (Continued)

Figure 1:
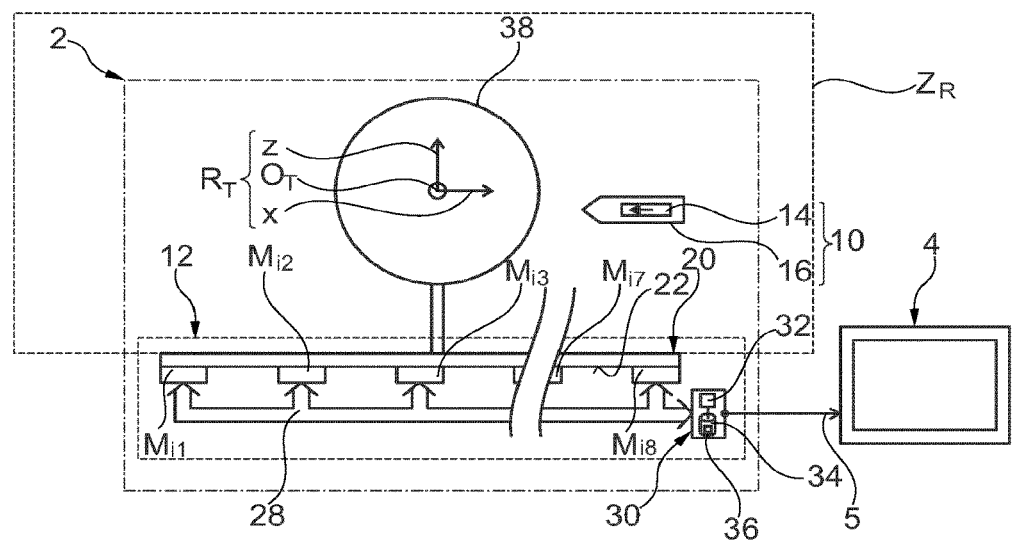

coordinates and from the direction of the magnetic moment of the permanent magnet; and controlling the graphical interface to display the constructed image on this graphical interface.

9 Claims, 2 Drawing Sheets

(51) Int. Cl.
 *G06F 3/0346* (2013.01)
 *G06F 3/038* (2013.01)
(52) U.S. Cl.
 CPC ....... *G06F 3/0346* (2013.01); *H04N 5/23229* (2013.01); *G06F 3/038* (2013.01)

METHOD FOR CONTROLLING A GRAPHICAL INTERFACE FOR DISPLAYING IMAGES OF A THREE-DIMENSIONAL OBJECT

The invention relates to a method and a device for controlling a graphical interface for displaying images of a three-dimensional object. Another subject of the invention is a medium for recording information for the implementation of this method.

Today, digital files coding three-dimensional objects and applications using such files are increasingly widespread. For example, computer-aided design (CAD) software applications allow such files to be generated. The service "Google Earth"® allowing the Earth to be observed from the sky is one example of an application using such a file. The application "Google Street View"® may also be mentioned, which allows what a pedestrian could see while walking in the streets of a town to be displayed.

A three-dimensional object is an object the position of each point of which in a three-dimensional space is a function of three coordinates in this space. A three-dimensional object is not necessarily in "relief". It may also be a plane image the position of each point of the image of which in the three-dimensional space is a function of the three coordinates of this point in the three-dimensional space.

A digital file is considered as coding a three-dimensional object if this file contains a sufficient amount of information for determining, using only this information, the position of each of the points of the object in a three-dimensional reference frame. In this three-dimensional reference frame, the position of each of the points of the object is given by three coordinates. Here, the reference frame used for coding the position of the points of the three-dimensional object in the file is referred to in the following as "virtual reference frame".

A three-dimensional reference frame is a reference frame whose axes typically form an orthonormal system.

A digital file may take the form of a database. It may also be fractionated into multiple parts recorded at different locations.

In practice, in order to construct from such a file an image in two dimensions intended to be displayed on a screen, it is necessary to know:
the position of the viewing point,
the direction of the optical axis, and
the field of view.

The field of view defines the outer limits of the image constructed in two dimensions. The field of view is typically defined by one or two viewing angles or angular field. The viewing angle A is often defined by the following relationship:

$\tan(A/2)=I/2f$, where

I is a dimension of the image in two dimensions, and
f is the focal distance of the objective lens used.

The optical axis corresponds to the line of sight of a camera. It therefore coincides with the bisectors of the viewing angles.

At the present time, such algorithms allowing an image to be constructed in two dimensions starting from a three-dimensional object coded in a file are well known and run quickly. In fact, the difficulty that remains to be resolved is above all to find a simple and intuitive means allowing a user to specify the three parameters that are:
the position of the viewing point,
the direction of the optical axis, and
the viewing angles.

Currently, in order to simplify the interactions with users, the viewing angles are generally taken equal to constants. Similarly, often, one or other of the position of the viewing point and of the direction of the optical axis are taken equal to a constant. However, despite these simplifications, the displaying of an image constructed in two dimensions starting from a three-dimensional object coded in a file remains a difficult task for a user. Indeed, it is not easy for this user to indicate precisely and simply the position of the viewing point or the direction of the optical axis.

The prior art is known from: U.S. Pat. No. 5,687,307A, US2006/061354A1, FR2586302A1, WO2011/174714A1.

The invention aims to overcome this drawback. For this purpose, one subject of the invention is a method for controlling a graphical interface according to claim 1.

The method hereinabove allows a user to indicate very simply and in a very intuitive manner the position of the viewing point and/or the direction of the optical axis in order to obtain an image in two dimensions from the three-dimensional object coded in the file.

The use of a permanent magnet simplifies the implementation of the pointer manipulated by the user because it is not necessary to power this pointer in order to generate a magnetic field. In addition, since the magnetic moment of a permanent magnet is oriented, it is easy to identify the direction in which the user wishes to observe the three-dimensional object.

Lastly, the choice of the coefficient $C_e$ to be strictly less than $d_z/d_{max}$ guarantees that, when matching the dimensions of the three-dimensional object with those of the measurement area, the three-dimensional object is entirely situated inside of this measurement area. Accordingly, this allows the user to move all around the three-dimensional object coded in the file without difficulty.

The embodiments of this method may comprise one or more of the features of the dependent claims.

These embodiments of the control method furthermore offer the following advantages:
the automatic determination of the scaling coefficient allows a manual intervention by the user to be avoided when a digital file is replaced by another digital file containing, for example, the same three-dimensional object, but on a different scale;
placing the geometrical center of the three-dimensional object on the geometrical center of the measurement area allows a coefficient $C_e$ closer to one to be used and hence the degradations in the resolution of the image constructed in two dimensions, caused by a very large or very small scaling coefficient, to be limited;
systematically choosing the coefficient $C_R$ equal to one makes the method faster because it is not necessary to iterate the step for matching the dimensions of the three-dimensional object with the measured coordinates of the permanent magnet at each displacement of the permanent magnet;
the triggering of an animation only for certain calculated coordinates or directions increases the interactivity of the method.

Another subject of the invention is a medium for recording information comprising instructions for the execution of the control method hereinabove when these instructions are executed by an electronic computer.

Another subject of the invention is a control device for a graphical interface according to claim 8.

The embodiments of this device can comprise the feature of the dependent claim.

Figure 2:
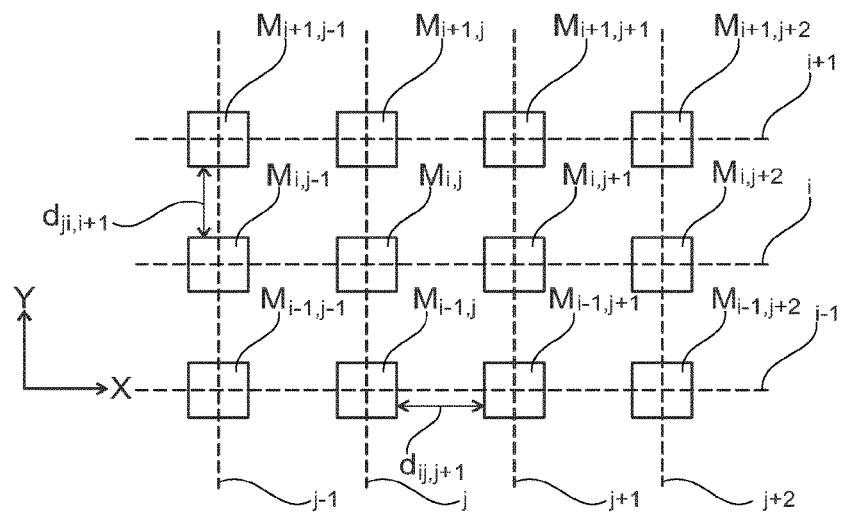
Figure 3:
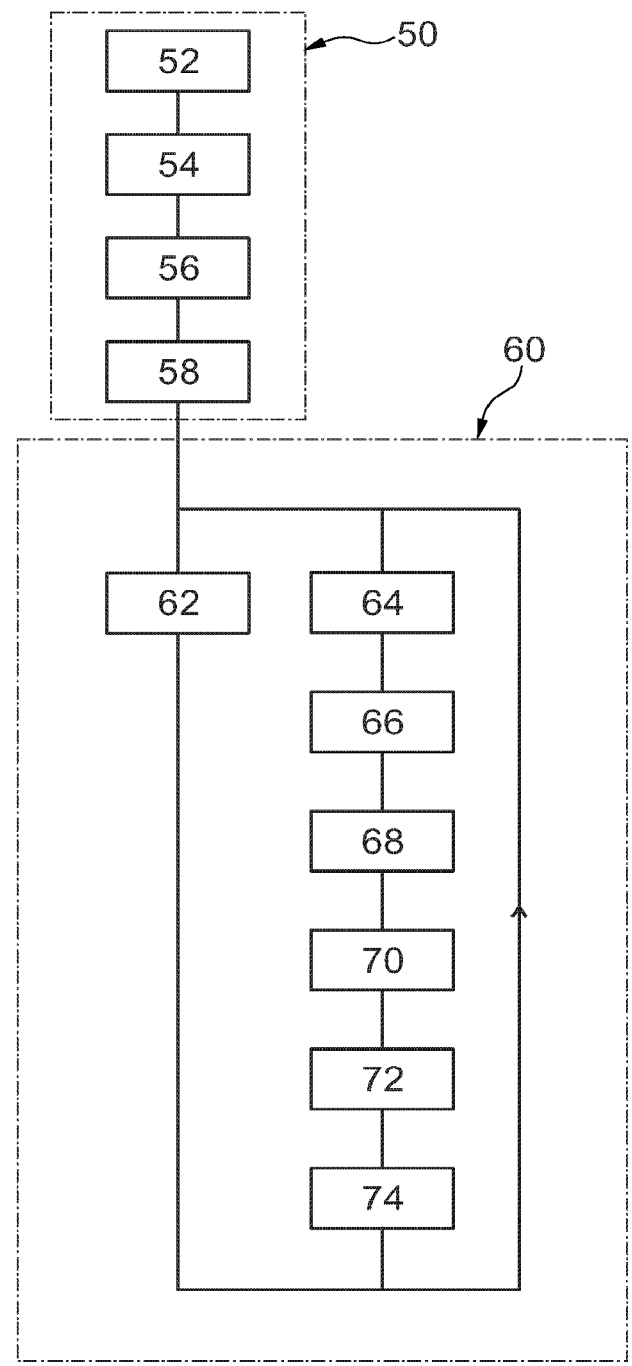

The invention will be better understood upon reading the description that follows, presented solely by way of non-limiting example, and with reference to the appended drawings in which:

FIG. 1 is a schematic illustration of a device for controlling a graphical interface, FIG. 2 is a partial schematic illustration showing a top view of a matrix of magnetometers used in the device in FIG. 1; and FIG. 3 is a flow diagram of a method for controlling a graphical interface by means of the device in FIG. 1.

In these figures, the same references are used to denote the same elements.

In the following part of this description, the features and functions well known to those skilled in the art are not described in detail.

FIG. 1 shows a device 2 for controlling a graphical interface 4 for observing a three-dimensional object. Here, the graphical interface is a screen connected to the device 2 by a wired link 5.

By way of illustration, the three-dimensional object is the Earth. The device 2 is used for selecting the region of the Earth that it is desired to display on the screen 4 together with the desired magnification. However, the device 2 may be adapted to many other applications, as is described at the end of this description.

The device 2 comprises a pointer 10 and a device 12 for localizing this pointer 10. The pointer 10 allows the user to indicate the viewing point and the direction in which he/she wishes to look at the Earth. Here, the pointer 10 can be freely moved within an orthogonal working reference frame $R_T$. This reference frame $R_T$ is fixed without any degree of freedom to the device 12. The axes X and Y of this reference frame $R_T$ are horizontal and the axis Z is vertical. The origin of the reference frame $R_T$ is denoted $O_T$.

In order to be localized by the device 12, the pointer 10 comprises at least one magnetic object 14. The object 14 is a permanent magnet exhibiting a non-zero magnetic moment even in the absence of an external magnetic field. For example, the coercive magnetic field of this magnet is greater than 100 A.m$^{-1}$ or 500 A.m$^{-1}$. Typically, it is made of a ferro- or ferrimagnetic material.

The object 14 has an oblong shape. In FIG. 1, the direction of the magnetic moment of the object 14 is represented by an arrow. The longest length of this object is henceforth denoted L. The power of the permanent magnet is typically greater than 0.01 A.m$^2$ or 0.1 A.m$^2$.

In this embodiment, the pointer 10 also comprises a non-magnetic utensil 16 on which or inside of which the object 14 is fixed with no degree of freedom. Non-magnetic is understood to mean a utensil made of a material not exhibiting any measurable magnetic property. Typically, the utensil 16 does not therefore exhibit any magnetic property, or negligible magnetic properties, with respect to the magnet that it is desired to identify.

For example, the utensil 16 is a wooden or plastic pencil comprising a point in the direction of the magnetic moment of the object 14. The utensil 16 also allows the manipulation of the object 14 to be facilitated if the latter is small. Here, the pointer 10 can be freely moved inside of a three-dimensional measurement region $Z_R$ directly by the hand of a human being. For this purpose, the pointer 10 weighs less than one kilo and, preferably, less than 200 g. The dimensions of this pointer are small enough so that it can be gripped and moved by a single hand of a user.

The device 12 allows the object 14 to be localized in the reference frame $R_T$ and hence the pointer 10 to be localized.

Localization is understood here to mean the determination of the position x, y, z of the object 14 in the reference frame $R_T$ and also the determination of the orientation of the object 14 with respect to the axes X, Y and Z of the reference frame $R_T$. For example, the orientation of the object 14 is represented by the angles $\theta_x$, $\theta_y$ and $\theta_z$ of the magnetic moment of the object 14 with respect to the axes X, Y and Z, respectively. In this embodiment, the origin $O_T$ of the reference frame $R_T$ is situated on the geometric center of the region $Z_R$. The geometric center of a region or of an object is the barycenter of this region or of this object obtained by assigning to each point of the region or of the object the same weight.

The device 12 comprises an array of N three-axis magnetometers $M_{ij}$. In FIG. 1, the vertical wavy lines indicate that a part of the device 12 has not been shown.

Typically, N is greater than five and, preferably, greater than sixteen or thirty-two. Here, N is greater than or equal to sixty-four.

In this embodiment, the magnetometers are aligned in rows and columns so as to form a matrix. Here, this matrix comprises eight rows and eight columns. The indices i and j identify, respectively, the row and the column of this matrix at the intersection of which the magnetometer $M_{ij}$ is located. In FIG. 1, only the magnetometers $M_{i1}$, $M_{i2}$, $M_{i3}$, $M_{i4}$ and $M_{i8}$ of a row i are visible. The position of the magnetometers $M_{ij}$ with respect to one another is described in more detail with reference to FIG. 2.

Each magnetometer $M_{ij}$ is fixed without any degree of freedom to the other magnetometers. For this purpose, the magnetometers $M_{ij}$ are fixed without any degree of freedom onto a rear face 22 of a rigid plate 20. This rigid plate has a front face turned toward the object 14. The plate 20 is made from a rigid non-magnetic material. For example, the plate 20 is made of glass.

Each magnetometer $M_{ij}$ measures the direction and the intensity of the magnetic field generated by the object 14. For this purpose, each magnetometer $M_{ij}$ measures the norm of the orthogonal projection of the magnetic field generated by the object 14 at this magnetometer $M_{ij}$ onto the three measurement axes of this magnetometer. Thus, each magnetometer $M_{ij}$ measures a vector $b_{ij}$ each coordinate of which represents the value of the magnetic field projected onto a respective measurement axis. Here, these three measurement axes are orthogonal to one another. For example, the measurement axes of each of the magnetometers $M_{ij}$ are, respectively, parallel to the axes X, Y and Z of the reference frame $R_T$.

The sensitivity of the magnetometers $M_{ij}$ is fixed. Here, the sensitivity of the magnetometer $M_{ij}$ is 4*10$^{-7}$T. Thus, if the object 14 is too far from these magnetometers, the measured signal can no longer be distinguished from the noise. The dimensions of the measurement region $Z_R$ are defined in such a manner that, whatever the position of the object 14 inside of this region $Z_R$, the object 14 is localized by the device 12 with a precision less than a predetermined threshold $S_p$. As illustrated in FIG. 1, this region $Z_R$ can then extend beyond the lateral dimensions of the matrix of magnetometers. For example, if the matrix of magnetometers forms a square which has a length of side B, the region $Z_R$ may contain a strip of width B/2 all around this matrix. The dimensions of the region $Z_R$ are determined experimentally or by calculation based on the sensitivity of the magnetometers $M_{ij}$.

Each magnetometer $M_{ij}$ is connected by means of a bus 28 for transmission of information to a processing unit 30.

The processing unit 30 is notably capable of processing the measurements of the magnetometers $M_{ij}$, and of controlling the screen 4 as a function of these measurements.

For this purpose, the unit 30 comprises a programmable electronic computer 32 capable of executing instructions recorded on an information storage media. The unit 30 therefore also comprises a memory 34 containing the instructions required for the execution by the computer 32 of the method in FIG. 3. The memory 34 also comprises a digital file 36 coding the dimensions and the details of the three-dimensional object that it is desired to observe on the screen 4. These dimensions and details are located, in this file, with respect to a three-dimensional virtual reference frame $R_V$ whose origin is denoted $O_V$. Here, this reference frame $R_V$ is an orthogonal reference frame. Furthermore, its position and its orientation with respect to the reference frame $R_T$ are known. Here, by default, the origin $O_V$ and the axes X, Y and Z of the reference frame $R_V$ coincide, respectively, with the origin $O_T$ and the axes X, Y and Z of the reference frame $R_T$. For example, this relationship between the reference frames $R_T$ and $R_V$ is recorded in the memory 34. The memory 34 also contains the dimensions of the measurement region $Z_R$ of the device 12.

The processing unit 30 is, in particular, able to determine the position and the orientation of a magnetic dipole in the reference frame $R_T$ based on the measurements from the magnetometers $M_{ij}$. For this purpose, the unit 30 implements a mathematical model $M_P$ associating each measurement of a magnetometer $M_{ij}$ with the position, orientation and amplitude of the magnetic moment of a magnetic dipole in the reference frame $R_T$. The model $M_P$ takes the form of a system of equations in which a first set of variables represents the position and the orientation of the magnetic dipole, together with the amplitude of the magnetic moment of this dipole. A second set of variables represents the measurements of the magnetometers $M_{ij}$. In order to obtain the position, the orientation and the amplitude of the magnetic moment of the magnetic dipole, the variables of the first set are the unknowns and the values of the variables of the second set are known. This model is typically constructed starting from the physical equations of electromagnetism. This model has input parameters which are the known distances between the magnetometers $M_{ij}$. In order to construct this model, the magnetic object 14 is approximated by a magnetic dipole. This approximation only introduces very small errors if the distance between the object 14 and the magnetometer $M_{ij}$ is greater than 2 L and, preferably, greater than 3 L, where L is the largest dimension of the object 14. Typically, L is less than 20 cm and, preferably, less than 10 or 5 cm.

Here, the model $M_P$ is non-linear. The unit 30 solves it by implementing an algorithm that estimates its solution. For example, the algorithm used is a global Kalman filter better known by the term "Unscented Kalman Filter".

The unit 30 is also capable of constructing an image to be displayed on the screen 4 using the data contained in the file 36, the position of a viewing point, the direction of an optical axis and a given viewing angle.

In this embodiment, the device 2 comprises a model 38 of the three-dimensional object to be observed. Here, the model 38 is a reduced model of the Earth. This model is fixed without any degree of freedom on top of the tablet 20 such that its geometric center coincides with the origin $O_T$ of the reference frame $R_T$. The dimensions of this model are such that it is entirely contained inside of the region $Z_R$.

FIG. 2 shows a part of the magnetometers $M_{ij}$ of the device 12. These magnetometers $M_{ij}$ are aligned in rows i parallel to the direction X. These magnetometers are also aligned in columns j parallel to the direction Y so as to form a matrix. The rows i and the columns j are disposed in order of increasing indices.

The center of the magnetometer $M_{ij}$ is located at the intersection of the row i and of the column j. The center of the magnetometer corresponds to the point where the magnetic field is measured by this magnetometer. Here, the indices i and j belong to the interval [1; 8].

The centers of two immediately consecutive magnetometers $M_{ij}$ and $M_{i,j+1}$ along a row i are separated by a known distance $d_{i,j,j+1}$. In a similar manner, the centers of two immediately consecutive magnetometers $M_{ij}$ and $M_{i+1,j}$ along the same column j are separated by a known distance $d_{j,i,i+1}$.

In the particular case described here, for any given row i, the distance $d_{i,j,j+1}$ is the same. This distance is therefore denoted $d_j$. Similarly, for any given column j, the distance $d_{j,i,i+1}$ between two magnetometers is the same. This distance is therefore denoted $d_i$.

Here, the distances $d_i$ and $d_j$ are both equal to d.

Typically, the distance d is in the range between 1 and 4 cm when:
the power of the permanent magnet is 0.5 A.m$^2$,
the sensitivity of the magnetometers is $4*10^{-7}$ T, and
the number of magnetometers $M_{ij}$ is sixty-four.

The operation of the device 2 will now be described with reference to the method in FIG. 3.

The method begins with an initialization phase 50. At the start of this phase, the device 2 allowing the screen 4 to be controlled is supplied then connected to this screen.

Subsequently, during a step 52, the dimensions of the measurement region $Z_R$, the dimensions of the model 38 and the file 36 are recorded in the memory 34. For example, the region $Z_R$ is a hemisphere of diameter 2B situated on top of the table 20 and whose plane part is situated in the plane containing the magnetometers $M_{ij}$. This hemisphere is centered on the matrix of magnetometers.

Here, the model 38 is a sphere of diameter $D_M$ whose center coincides with the origin $O_T$. Finally, it is also assumed here that the dimensions of the three-dimensional object coded in the file 36 are scaled to one. Given that the three-dimensional object is the Earth, its dimensions are expressed in kilometers or in meters in the file 36.

Subsequently, during a step 54, if the geometric center of the three-dimensional object coded in the file 36 does not coincide with the origin $O_V$ of the reference frame $R_V$, then the unit 30 translates the three-dimensional object into the reference frame $R_V$ in such a manner that its geometric center does coincide with the origin $O_V$ of this reference frame. The new digital file containing the translated three-dimensional object is subsequently recorded in place of the previous digital file 36.

During a step 56, the unit 30 automatically determines a scaling coefficient $C_e$ from the dimensions of the three-dimensional object coded in the digital file 36 and from the known dimensions of the region $Z_R$. This coefficient $C_e$ is subsequently used to multiply the dimensions of the three-dimensional object by this coefficient $C_e$ in such a manner as to obtain a three-dimensional object brought to scale. Here, this coefficient $C_e$ is chosen in such a manner that the three-dimensional object brought to scale is situated entirely inside of the region $Z_R$. For this purpose, this coefficient $C_e$ is chosen to be less than the ratio $d_Z/d_{max}$, where:
$d_{max}$ is the distance between the origin $O_T$ and the point of the three-dimensional object furthest from this origin $O_T$ along a measurement axis, and $d_Z$ is the distance between the origin $O_T$ and the point of the measurement area furthest from this origin along the same measurement axis, and the measurement axis retained is an axis going through the origin $O_T$ and which maximizes the difference $|d_{max}-d_Z|$, where $|\ldots|$ is the absolute value function.

Thus, for example, the unit 30 firstly calculates the ratio $d_Z/d_{max}$ using the information recorded in the memory 34 during the step 52. In the particular case described here, the measurement axis which maximizes the difference $|d_{max}-d_Z|$ is the axis Z. The distance $d_{max}$ is equal to the radius of the Earth recorded in the digital file 36.

Subsequently, the value of the coefficient $C_e$ is chosen equal to $a*(d_Z/d_{max})$, where "a" is a pre-recorded constant less than or equal to one. Preferably, the constant "a" is greater than 0.1 or than 0.5.

In this particular embodiment, the coefficient $C_e$ is furthermore determined so that the three-dimensional object brought to scale coincides with the model 38 in the reference frame $R_T$. To this end, the constant "a" is chosen equal to $(D_M d_{max})/(D_V d_Z)$, where $D_V$ is the diameter of the Earth coded in the digital file 36. In the particular case where the dimensions of the model are known, it is also possible to calculate directly the value of the coefficient $C_e$ without going through the calculation of the ratio $d_Z/d_{max}$. For example, here, the value of the coefficient $C_e$ is equal to $D_M/D_V$.

During an operation 58, the unit 30 determines the dimensions of the field of view. Here, the field of view is defined by two viewing angles $\theta_H$ and $\theta_V$. The angles $\theta_H$ and $\theta_V$ are respectively the viewing angles in the horizontal and vertical planes. In order to simplify the description, these angles are both taken equal to pre-recorded constants.

Lastly, the orientation of the field of view is chosen to be constant. Here, it is assumed that the vertical of the image always coincides with the direction Z of the reference frame $R_T$.

Once the initialization phase 50 has been executed, the unit 30 carries out a phase 60 using the device 2 for controlling the display of images of the Earth on the screen 4.

For this purpose, during a step 62, a user holds the pointer 10 and manipulates it inside of the region $Z_R$ as if it were a camera allowing him/her to film the surface of the model 38. For this purpose, the user places the pointer 10 at the location of the viewing point that he/she wishes to use and directs the point of the utensil 16 along the optical axis that he/she wishes to use.

In parallel with the step 62, during a step 64, the magnetometers $M_{ij}$ measure the magnetic field generated by the object 14.

Then, during a step 66, these measurements are acquired by the processing unit 30.

During a step 68, the unit 30 then calculates the coordinates of the object 14 in the reference frame $R_T$ based on the measurements acquired during the step 66. The unit 30 also calculates, using these measurements, the direction and the amplitude of the magnetic moment of the object 14 in the reference frame $R_T$.

During a step 70, the unit 30 matches the dimensions of the three-dimensional object with respect to the coordinates calculated during the step 68. Here, if it has not already been done, this consists in multiplying all the dimensions of the three-dimensional object coded in the digital file 36 by the coefficient $C_e$ in such a manner as to obtain a three-dimensional object brought to scale. The dimensions of this three-dimensional object brought to scale are expressed in the reference frame $R_T$. They are stored in the memory 34 in order not to have to redo these multiplications during the next iteration of the step 70.

During a step 72, the unit 30 constructs an image in two dimensions from the three-dimensional object brought to scale, which corresponds to the image that would be obtained if this three-dimensional object were filmed:

from a viewing point equal to the position of the object 14 calculated during the step 68, along an optical axis that coincides with the direction of the magnetic moment calculated during the step 68, in the direction of the magnetic moment calculated during the step 68, with the viewing angles $\theta_H$ and $\theta_V$ fixed during the initialization phase 50, and with the vertical direction of the constructed image coinciding with the axis Z of the reference frame $R_T$.

For example, the image in two dimensions is constructed by the unit 30 with the aid of an orthogonal projection of the three-dimensional object brought to scale onto a plane perpendicular to the optical axis and only conserving the points of this three-dimensional object brought to scale included within the field of the camera defined by the angles $\theta_V$ and $\theta_H$.

The construction of such an image in two dimensions starting from a three-dimensional object is well known. In this respect, reference could for example be made to the algorithms used in computer-aided design (CAD) software applications.

Subsequently, during a step 74, the unit 30 generates a command to display the image constructed during the step 72 on the screen 4.

The steps 64 to 74 are iterated each time that the pointer 10 is displaced.

Thus, with the device 2, by manipulating the pointer 10 as a camera, the user can readily and very intuitively indicate both the position of the viewing point and the direction of the optical axis to be used for constructing an image in two dimensions from the three-dimensional object coded in the digital file 36. In particular, the user experiences the ordinary behavior of a camera such as, for example:

the enlargement of the region filmed by the camera when the pointer 10 approaches the surface of the model 38, the displacement of the image constructed in two dimensions toward the right when the pointer 10 is turned to the right and vice versa, and the displacement of the position of the viewing point when the position of the pointer 10 is moved.

Numerous other embodiments are possible. For example, it is possible to fix the direction of the optical axis such that this direction is independent of the displacements of the pointer 10. Accordingly, the displacement of the pointer 10 is only used to indicate the position of the viewing point. Conversely, it is also possible to fix the position of the viewing point such that this position is independent of the position of the pointer 10. In the latter embodiment, the pointer 10 is then only used to indicate the direction of the optical axis to be used.

In other embodiments, the displacement of the object 14 inside of the measurement region $Z_R$ is not entirely free but guided so as to limit the number of degrees of freedom of the pointer 10. For example, the pointer 10 is installed to slide on a rail such that it can only move inside of the region $Z_R$ by following this rail.

In the preceding embodiment, the device 2 has been described in the particular case where the relationship between the measured position of the pointer 10 and the position of the viewing point in the reference frame $R_T$ is an identity relationship. However, as a variant, this relationship may be replaced by any given bijective relationship. For example, the relationship between the position of the pointer 10 and the position of the viewing point is a non-linear relationship, such as an exponential relationship. Accordingly, a movement of the pointer 10 close to the surface of the model 38 and the same movement, but far from this surface, do not modify the position of the viewing point in the same way. It is also possible to link the orientation of the optical axis to the direction of the magnetic moment of the object 14 by a bijective function other than the identity function.

Matching the dimensions of the three-dimensional object with the measured coordinates of the pointer 10 may also be achieved by leaving the dimensions of the three-dimensional object unchanged and by multiplying the measured coordinates of the pointer 10 by the inverse of the coefficient $C_e$. This multiplication must then be performed at each iteration of the step 70. More generally speaking, it is possible to multiply the dimensions of the three-dimensional object by a coefficient $C_V$ and, at the same time, to divide the coordinates of the pointer 10 by a coefficient $C_R$. In this case, these coefficients $C_V$ and $C_R$ are chosen such that the following relationship is verified: $C_V/C_R=C_e$.

In one simplified embodiment, the coefficient $C_e$ is not determined automatically but fixed by the user, for example, during the initialization phase.

As a variant, the pointer 10 comprises two permanent magnets whose magnetic moment directions form an angle in the range between 10° and 170° within the plane containing these two directions. The device 12 is then adapted for localizing these permanent magnets. For this purpose, the model $M_P$ is established by modeling the magnetic interactions between the magnetometers $M_{ij}$ and two magnetic dipoles simultaneously present in the measurement area. The fact that the directions of the magnetic moments of the two permanent magnets are not co-linear allows the device 12 to determine the roll angle of the pointer 10 about its longitudinal direction. This roll angle is subsequently used, for example, for controlling a rotation of the constructed image about the optical axis. In this embodiment, the vertical direction of the constructed image is not fixed in advance but determined based on the position of the permanent magnets.

The three-dimensional object may be any type of object. For example, it could be a town or a district comprising streets and buildings in three dimensions. The method described previously then allows the user to obtain, in a very intuitive manner, the viewing point and the optical axis from which the town or the district is observed. It could also be the interior of a building such as a museum or a condominium. The three-dimensional object does not necessarily correspond to an existing object in the real world. For example, it could represent an imaginary world created for a video game.

Moreover, the three-dimensional object may comprise animated parts. For example, in the case where the three-dimensional object is a model of a town, the digital file may in addition code the movement of pedestrians or of vehicles in the streets of this town.

As a variant, the processing unit 30 is programmed to trigger the execution of an animation directly viewable by a human being as a function of the measured position and orientation of the pointer 10. Typically, the animation is a graphical animation displayed on a screen or an audio animation directly audible by a human being when it is played by a loudspeaker. The graphical animation is, preferably, incorporated into the constructed image in such a manner as to be displayed on the same screen as that on which the constructed image is displayed. This allows the device 2 to be made more interactive. For example, when the pointer 10 is directed toward a particular region of the three-dimensional object, this triggers the playing of an audio track directly audible by the user. For example, the audio track played comprises a commentary specific to this particular region. The processing unit 30 may also be programmed to trigger, in response to a range of positions and/or of orientations of the pointer 10, a graphical animation directly visible on the screen 4. In this latter case, this allows the required processing power to be limited because the graphical animations that are not visible are not executed. There is thus the possibility of producing a game in this way.

The dimensions of the three-dimensional object coded in the digital file are not necessarily greater than the dimensions of the region $Z_R$. Conversely, the digital file may code dimensions of a three-dimensional object much smaller than the dimensions of the region $Z_R$. For example, the three-dimensional object may be an atom or a molecule. In this case, the coefficient $C_e$ is much greater than one.

The matching step 70 may also be carried out during the initialization phase when only the dimensions of the three-dimensional object are multiplied by the coefficient $C_e$.

In the preceding embodiment, the graphical interface has been described in the particular case where the latter is a screen 4. However, the graphical interface may be any type of interface allowing an image to be displayed, such as for example the screen of a television or of a computer or even a projector or an overhead projection system.

In one simplified embodiment, the model 38 is omitted. In this case, the user directs him/herself in the measurement area using for this purpose the images in two dimensions displayed on the screen 4.

Numerous different methods may be used to determine the position and the orientation of the permanent magnet. For example, the method described in U.S. Pat. No. 6,269,324 may be used. These methods do not necessarily use a Kalman filter. For example, the methods described in US2002/171427A1 or U.S. Pat. No. 6,263,230B1 are possible.

The magnetometers in the array of magnetometers are not necessarily arranged into columns and rows. They may also be arranged according to other patterns. For example, the magnetometers are disposed at each apex of each triangular or hexagonal unit of a plane meshing.

The disposition of the magnetometers with respect to one another may also be random or irregular. Thus, the distance between two immediately consecutive magnetometers in the array is not necessarily the same for all the pairs of two immediately consecutive magnetometers. For example, the density of magnetometers within a given area of the array may be greater than elsewhere. Increasing the density within a given area can allow the precision of the measurement within this area to be increased.

The array of magnetometers may also extend in three non-co-linear directions of space. Under these conditions, the magnetometers are distributed inside of a three-dimensional volume.

The number N of magnetometers may also be greater than or equal to sixty-four or ninety.

Not all the magnetometers of the array of magnetometers are necessarily identical to one another. As a variant, the magnetometers do not all have the same sensitivity. In this case, the less accurate magnetometers are for example disposed near to the center of the array, whereas the most accurate magnetometers are disposed on the periphery of this array. Such an embodiment offers the advantage of placing the magnetometers that are most difficult to saturate, and hence the least sensitive, at the locations likely to be the closest to the magnetic object. This also allows the region of interaction to be extended.

The invention claimed is:

1. A method for controlling a graphical interface for displaying images of a three-dimensional object, comprising:

providing an array of magnetometers comprising N three-axis magnetometers mechanically connected to one another with no degree of freedom to conserve a known distance between each of the magnetometers, wherein N is an integer number greater than or equal to five, the array of magnetometers being associated:

with a working three-dimensional reference frame whose position is known with respect to the array of magnetometers, and with a predetermined three-dimensional measurement area;

recording a digital file coding dimensions of the three-dimensional object in a three-dimensional reference frame as a virtual reference frame, a position of the virtual reference frame with respect to the working reference frame being known such that coordinates of each point of the virtual reference frame may be expressed in the working reference frame by a change of reference frame;

providing a pointer comprising a permanent magnet manually moveable by a user inside of the measurement area;

measuring, when the permanent magnet is placed inside of the measurement area, by the magnetometers of the array, the magnetic field generated by the permanent magnet;

calculating coordinates of the permanent magnet and of a direction of the magnetic moment of the permanent magnet in the working reference frame based on the measurements of the magnetometers;

matching the dimensions of the three-dimensional object with the coordinates previously calculated by multiplying each dimension of the three-dimensional object by a coefficient $C_V$ to obtain a three-dimensional object brought to scale and by multiplying the coordinates calculated by inverse of a coefficient $C_R$ to obtain coordinates to scale, wherein the coefficients $C_V$ and $C_R$ are chosen such that the ratio $C_V/C_R$ is equal to a scaling coefficient $C_e$, the coefficient $C_e$ being strictly less than $d_Z/d_{max}$, wherein:

$d_{max}$ is the distance between the origin of the working reference frame and the point of the three-dimensional object furthest from the origin along a measurement axis, and $d_Z$ is the distance between the origin of the working reference frame and the point of the measurement area furthest from the origin along the same measurement axis, the measurement axis retained being the axis going through the origin of the working reference frame and for which the difference $|d_{max}-d_Z|$ is maximized, constructing an image in two dimensions corresponding to the image of the object brought to scale observed from a viewing point and along a predetermined optical axis, the position of the viewing point being deduced from the coordinates to scale, and the direction of the optical axis being deduced from the measured direction of the magnetic moment of the permanent magnet; and controlling the graphical interface to display the image constructed on the graphical interface.

2. The method as claimed in claim 1, further comprising automatic determination of the scaling coefficient $C_e$ by automatically calculating the ratio $d_Z/d_{max}$ based on the dimensions of the three-dimensional object coded in the digital file and on the known dimensions of the measurement area, then by taking the value of the coefficient $C_e$ equal to $a*(d_Z/d_{max})$, wherein a is a pre-recorded constant.

3. The method as claimed in claim 2, wherein, prior to the automatic determination of the scaling coefficient $C_e$, the method comprises translation of the coordinates of each point of the three-dimensional object into the virtual reference frame so that the geometric center of the translated three-dimensional object coincides with the geometric center of the measurement area and the determination of the coefficient $C_e$ is carried out based on the dimensions of the three-dimensional object thus translated.

4. The method as claimed in claim 1, further comprising automatic determination of the scaling coefficient $C_e$ based on a ratio between a dimension of the three-dimensional object coded in the digital file and of a known dimension of a model of the object contained inside of the measurement area.

5. The method as claimed in claim 1, wherein the coefficient $C_R$ is systematically taken equal to one such that only the dimensions of the three-dimensional object are brought to scale.

6. The method as claimed in claim 1, wherein, depending on the calculated coordinates or on the calculated direction of the permanent magnet, an animation directly visible to a human being is executed at a same time that a command is sent to the graphical interface for displaying the constructed image corresponding to the calculated coordinates or to the calculated direction.

7. A non-transitory computer readable medium comprising instructions for the execution of a method as claimed in claim 1, when the instructions are executed by an electronic computer.

8. A device for controlling a graphical interface for displaying images of a three-dimensional object, comprising:

an array of magnetometers comprising N three-axis magnetometers mechanically connected to one another with no degree of freedom to conserve a known distance between each of the magnetometers, wherein N is an integer number greater than or equal to five, the array of magnetometers being associated:

with a three-dimensional working reference frame whose position is known with respect to the array of magnetometers, and with a predetermined three-dimensional measurement area;

a digital file coding dimensions of the three-dimensional object in a three-dimensional reference frame as a virtual reference frame, a position of the virtual reference frame with respect to the working reference frame being known such that coordinates of each point of the virtual reference frame may be expressed in the working reference frame by a change of reference frame and vice versa;

a pointer comprising a permanent magnet manually moveable by a user inside of the measurement area, a processing unit programmed for:

when the permanent magnet is placed inside of the measurement area, acquiring the measurement, carried out by the magnetometers of the array, of the magnetic field generated by the permanent magnet, calculating coordinates of the permanent magnet and the direction of the magnetic moment of the permanent magnet in the working reference frame based on the measurements of the magnetometers, matching dimensions of the three-dimensional object with the coordinates previously calculated by multiplying each dimension of the three-dimensional object by a coefficient $C_V$ to obtain a three-dimensional object brought to scale and by multiplying the calculated coordinates by inverse of a coefficient $C_R$ to obtain coordinates to scale, wherein the coefficients $C_v$ and $C_R$ are chosen such that the ratio $C_V/C_R$ is equal to a scaling coefficient $C_e$, this coefficient $C_e$ being strictly less than $d_Z/d_{max}$, wherein:

$d_{max}$ is the distance between the origin of the working reference frame and the point of the three-dimensional object furthest from the origin along a measurement axis, and $d_Z$ is the distance between the origin of the working reference frame and the point of the measurement area furthest from the origin along the same measurement axis, the measurement axis retained being the axis going through the origin of the working reference frame and for which the difference $|d_{max}-d_Z|$ is maximized;

constructing an image in two dimensions corresponding to the image of the object brought to scale observed from a viewing point and along a predetermined optical axis, the position of the viewing point being deduced from the coordinates to scale, and the direction of the optical axis being deduced from the measured direction of the magnetic moment of the permanent magnet; and sending a command to the graphical interface to display the constructed image of the three-dimensional object on the graphical interface.

9. The device as claimed in claim 8, further comprising a real model of the three-dimensional object whose dimensions are equal to the dimensions of the three-dimensional object brought to scale, the model being placed in the working reference frame at a same location as the three-dimensional object brought to scale.

* * * * *